(12) United States Patent
Chen et al.

(10) Patent No.: US 9,093,560 B2
(45) Date of Patent: Jul. 28, 2015

(54) GATE HEIGHT UNIFORMITY IN SEMICONDUCTOR DEVICES

(71) Applicant: GLOBALFOUNDRIES Inc., Grand Cayman, KY (US)

(72) Inventors: Tsung-Liang Chen, Cohoes, NY (US); Hung-Wei Liu, Saratoga Springs, NY (US); Rohit Pal, Clifton Park, NY (US); Hsin-Neng Tai, Clifton Park, NY (US); Huey-Ming Wang, Ballston Lake, NY (US); Tae Hoon Lee, Clifton Park, NY (US); Songkram Srivathanakul, Waterford, NY (US); Danni Chen, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 14/032,740

(22) Filed: Sep. 20, 2013

(65) Prior Publication Data

US 2015/0084131 A1    Mar. 26, 2015

(51) Int. Cl.
*H01L 21/31* (2006.01)
*H01L 21/8238* (2006.01)
*H01L 27/092* (2006.01)

(52) U.S. Cl.
CPC  *H01L 21/823857* (2013.01); *H01L 21/823864* (2013.01); *H01L 27/092* (2013.01)

(58) Field of Classification Search
CPC .................. H01L 21/31695; H01L 21/76801; H01L 21/312; H01L 21/7682; H01L 23/5329
USPC .......................... 438/758, 778, 781, 784, 787
See application file for complete search history.

(56) References Cited

U.S. PATENT DOCUMENTS 8,685,867 B1 *   4/2014   Danek et al. .................. 438/787

* cited by examiner

*Primary Examiner* — Quoc Hoang

(74) *Attorney, Agent, or Firm* — Heslin Rothenberg Farley & Mesiti P.C.; Nicholas Mesiti, Esq.

(57) ABSTRACT

Methods of facilitating gate height uniformity by controlling recessing of dielectric material and semiconductor devices formed from the methods are provided. The methods include, for instance, forming a transistor of the semiconductor device with an n-type transistor and a p-type transistor, the n-type transistor and the p-type transistor including plurality of sacrificial gate structures and protective masks at upper surfaces of the plurality of sacrificial gate structures; providing a dielectric material over and between the plurality of sacrificial gate structures; partially densifying the dielectric material to form a partially densified dielectric material; further densifying the partially densified dielectric material to create a modified dielectric material; and creating substantially planar surface on the modified dielectric material, to control dielectric material recess and gate height.

14 Claims, 7 Drawing Sheets

US 9,093,560 B2

GATE HEIGHT UNIFORMITY IN SEMICONDUCTOR DEVICES

FIELD OF THE INVENTION

The present invention relates to semiconductor devices and methods of fabricating semiconductor devices, and more particularly, to facilitating gate height uniformity by controlling recessing of dielectric material for use in, for instance, semiconductor fabrication processing.

BACKGROUND

As is known, semiconductor device fabrication typically includes transistor fabrication processing, which may involve conductive material deposition into appropriately configured openings in an intermediate circuit structure to create, for instance, gate structures of the transistors. This fabrication processing technique is often referred to as gate metallization processing. As the integration density of transistor continues to increase, the footprint area occupied by individual transistors necessarily continues to decrease. This ever-decreasing transistor size can result in challenges to the performance characteristics of the transistors, due to issues related to traditional fabrication processing techniques, including issues related to lack of planarity or uniformity of the gate structures, due to oxide loss and material recess.

BRIEF SUMMARY

The shortcomings of the prior art are overcome and additional advantages are provided through the provision, in one aspect, of a method which includes, for instance: forming a transistor of the semiconductor device with a p-type transistor and an n-type transistor, the p-type transistor and the n-type transistor including a plurality of sacrificial gate structures and protective masks at upper surfaces thereof; providing a dielectric material over and between the plurality of sacrificial gate structures; partially densifying the dielectric material to form a partially densified dielectric material; further densifying the partially densified material to create a modified dielectric material; and creating substantially planar surface on the modified dielectric material, to control dielectric material recess and gate height.

In a further aspect, a semiconductor device is provided which includes a transistor of the semiconductor device with a p-type transistor and an n-type transistor; a plurality of sacrificial gate structures disposed over the p-type transistor and the n-type transistor, the plurality of sacrificial gate structures including protective hard masks at upper surfaces thereof, and being surrounded with modified dielectric material, the modified dielectric material being further densified partially densified dielectric material; and wherein the modified dielectric material is substantially planar with upper surfaces of protective mask overlap of the p-type transistor and the n-type transistor so as to control dielectric material recess and gate height.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
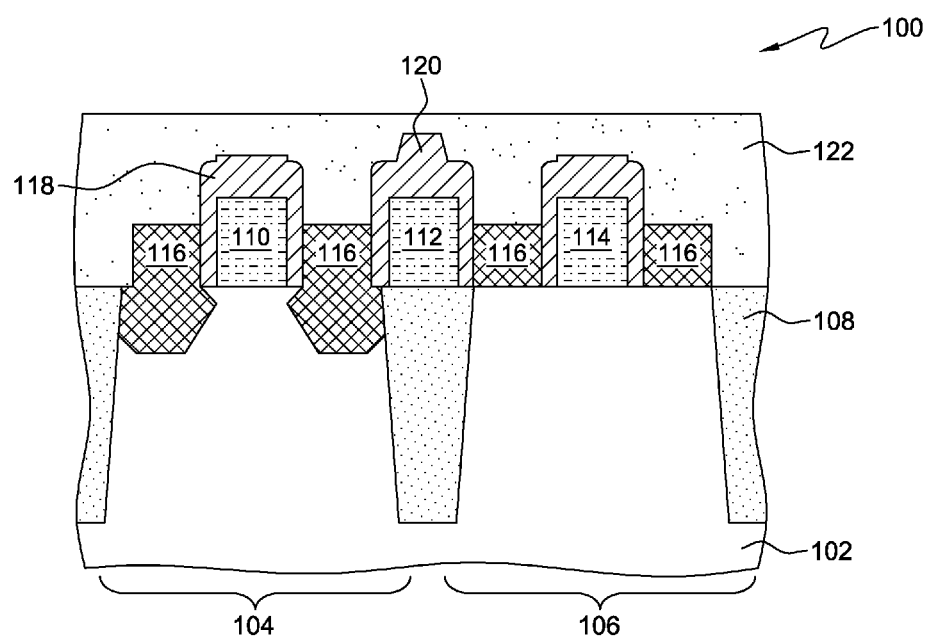
FIG. 1 is a cross-sectional elevational view of one embodiment of an intermediate structure, including a plurality of sacrificial gate structures and dielectric material surrounding the sacrificial gate structures, obtained during semiconductor fabrication process, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

In advanced semiconductor fabrication technologies, replacement gate (RMG) processing is often employed to provide metal gate structures. In an RMG process, sacrificial gate structures, such as amorphous silicon (a-Si) or polysilicon gate structures, initially hold the positions for the subsequent metal gate structures to be formed. For example, an a-Si or polysilicon gate may be used during initial processing until a high-temperature annealing to activate source/drain implants has been completed. Subsequently, the sacrificial gate structures may be removed and replaced with replacement metal gates. As technology nodes continue to decrease, significant challenges continue to arise for RMG processing.

In particular, conventional processing can result in variations in the height of resultant replacement metal gates. This lack of planarity or uniformity arises, at least in part, in conventional RMG processing from recesses or loss in dielectric material over and between the sacrificial gate structures. More particularly, the loss in dielectric material, disposed over and between the protective mask protecting the sacrificial gate structures, are translated into height variation in the sacrificial gate structures. In a specific example, the recesses in dielectric material, disposed over and between the protective mask overlap, protecting the sacrificial gate structures at the junction of p-type transistor and n-type transistor, are translated into height variation in the sacrificial gate structures. As explained further below, during the semiconductor fabrication process, a variety of gap fill materials such as, a flowable dielectric material (e.g., flowable oxide) are typically employed as dielectric material surrounding the sacrificial gate structures. However, the quality of gap fill may typically be poor and the flowable dielectric material may be vulnerable to subsequent wet/dry etch processing. Significant dielectric material loss can occur if subsequent wet/dry etch processing is excessive. This loss of dielectric material can affect the height variations of the sacrificial gate structures and thereby resulting in replacement metal gate height variations, during subsequent fabrication processing.

As explained further below, the methods (and resultant semiconductor devices) disclosed herein address these challenges of existing RMG processes, and thereby enhance the use of replacement gates in advanced technology nodes.

Generally stated, disclosed herein, in one aspect, is a method which includes: forming a transistor of the semiconductor device with a p-type transistor and an n-type transistor, the p-type transistor and the n-type transistor including a plurality of sacrificial gate structures and protective hard masks at upper surfaces thereof; conformally depositing a dielectric material over and between the plurality of sacrificial gate structures; partially densifying the dielectric material to form a partially densified dielectric material; further densifying the partially densified dielectric material to create a modified dielectric material; and creating substantially planar surface on the modified dielectric material, to control dielectric material recess and gate height.

By way of example, the partially densifying the dielectric material, in one aspect, includes annealing the dielectric material, by subjecting the dielectric material, for instance, to steam annealing conditions to create a partially densified dielectric material. In another aspect, the further densifying the partially densified dielectric material includes, for instance, exposing the partially densified dielectric material to remote plasma, to create a modified dielectric material.

In one embodiment, the further densifying the dielectric material also includes treating the modified dielectric material with a high density plasma deposition or a plasma-enhanced tetraethyl ortho silicate deposition, to deposit a high aspect ratio oxide. The creating the substantially planar surface includes planarization of the modified dielectric material which, in one example, may include the high aspect ratio oxide and the planarization thereby, forming a plasma-treated surface at a protective mask overlap of the p-type transistor and the n-type transistor. In this implementation, the dielectric material is conformally deposited about 0 nanometers to about 50 nanometers above the protective mask overlap of the p-type transistor and the n-type transistor.

In another embodiment, further modifying the dielectric material includes performing controlled planarization of the partially densified dielectric material where the controlled planarization is performed prior to performing further densification of the partially densified dielectric material. In one example, further modifying the dielectric material includes partially removing the partially densified dielectric material prior to further densifying the partially densified dielectric material. The partially removing further includes planarization of the partially densified dielectric material to form a substantially planar surface of about 20 nanometers to about 30 nanometers over the protective mask overlap of the p-type transistor and the n-type transistor. The creating the substantially planar surface includes planarization of the modified dielectric material, where the planarization forms a substantially planar surface at the protective mask overlap of the p-type transistor and the n-type transistor.

In a further aspect, the creating the substantially planar surface includes removing the protective masks to expose the sacrificial gate structures thereafter, and subsequently removing exposed sacrificial gate structures. Resultant semiconductor devices are also described and claimed herein.

Reference is made below to the drawings, which are not drawn to scale for ease of understanding, wherein the same reference numbers used throughout different figures designate the same or similar components.

By way of example, FIGS. 1-5 depict one detailed embodiment of a method of facilitating gate height uniformity by controlling recessing of the dielectric material surrounding the sacrificial gate structures and the protective masks disposed at the upper surfaces of the sacrificial gate structures.

FIG. 1 illustrates an intermediate structure 100, attained during semiconductor fabrication processing, in accordance with one or more aspects of the present invention. At the point of fabrication, depicted in FIG. 1, intermediate structure 100 includes a substrate 102, such as a bulk semiconductor material, for example, a bulk silicon wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement (SRI) substrates and the like. Substrate 102 may in addition or instead include various isolations, dopings, and/or device features. The substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Continuing with FIG. 1, intermediate structure 100 includes a plurality of transistors, for instance, P-type field-effect transistor (PFET) 104 (referred to hereafter, as p-type transistor) and N-type field-effect transistor (NFET) 106 (referred to, hereafter, as n-type transistor) formed over substrate 102. The p-type transistor 104 and n-type transistor 106 are laterally separated by isolation features 108, such as, for example, shallow trench isolation features (STI). The formation of isolation regions, such as shallow trench isolation may include, for instance, forming a recess within the substrate and filling the trench with a dielectric material, such as, for example, high-density plasma (HDP) oxide or TEOS (tetraethylorthosilicate) base silicon oxide, silicon nitride and the like. Although not critical to the invention, p-type transistor 104 and n-type transistor 106 may include, corresponding adjacent sacrificial gate structures 110, 112 and 114 respectively, with sacrificial gate structure 112 being disposed at the junction of p-type transistor 104 and n-type transistor 106. In one example, the sacrificial gate structures may include a sacrificial gate material, such as, for example, amorphous-silicon, to hold the gate position for subsequent metal gate structures to be formed.

Although not critical to the invention, source and drain region (hereafter referred to as active region 116) is provided over substrate 102. Active region 116 may be formed using any suitable techniques, including, for example, ion implantation, epitaxial growth of the embedded source/drain materials and activation anneals.

A protective mask 118 may further be provided along the sidewalls and the upper surfaces of respective adjacent sacrificial gate structures 110, 112 and 114. Protective mask 118 may be deposited using conventional deposition processes, such as, for example, chemical vapor deposition (CVD), atomic layer deposition (ALD), low-pressure CVD, or plasma-enhanced CVD (PE-CVD). In one example, protective mask 118 may have a conventional thickness and may include or be fabricated of a material such as, for example, silicon nitride. In a specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogen-free precursor such as, for example, bis(t-butylamino)silane (BTBAS) ($SiC_8N_2H_{22}$) and ammonia ($NH_3$) at about 550° C. As understood by one skilled in art, protective mask 118 creates a protective mask overlap 120 over the upper surface of sacrificial gate structure 112, disposed at the junction of p-type transistor 104 and n-type transistor 106. Although not critical to the invention, in one example, a layer of protective mask 118 may also extend over active region 116 to facilitate protection of the active region, during subsequent fabrication processing.

A dielectric material 122 may then be disposed over (for instance, above the protective masks, including the protective mask overlap, overlying the adjacent sacrificial gate structures) and between adjacent sacrificial gate structures 110, 112 and 114. As one example, dielectric material 122 may be or include an organic material such as, a field oxide of relatively low quality within the spectrum of available oxides. For instance, the field oxide may include, a flowable oxide such as, for example, a hydrogen silsesquioxane polymer or a carbon-free silsesquioxane polymer, which may be deposited as dielectric material 122 by flowable chemical vapor deposition (F-CVD). In another example, dielectric material 122 may include, but not limited to, silicon nitride (SiN), silicon nitride ($Si_3N_4$), silicon oxide ($SiO_2$), fluorinated silicate glass (FSG). By way of example, in one implementation, dielectric material 122 may be partially conformally deposited about 0 nanometers to about 50 nanometers above protective mask overlap 120, (for instance, at the junction) of p-type transistor 104 and n-type transistor 106.

Figure 2:
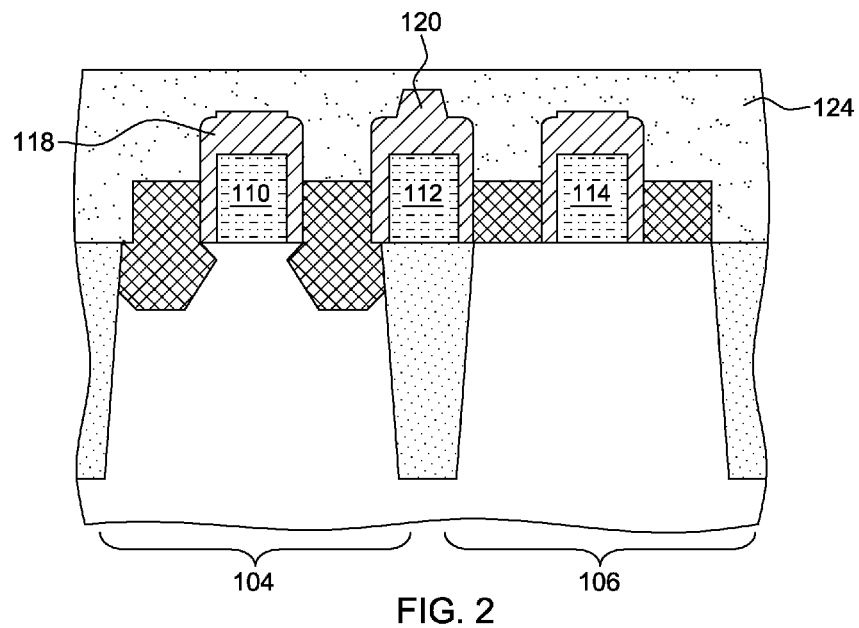
FIG. 2 depicts the structure of FIG. 1 after partial densification of the dielectric material has been performed, in accordance with one or more aspects of the present invention.

As depicted in FIG. 2, dielectric material 122 of FIG. 1, disposed over and between adjacent sacrificial gate structures 110, 112 and 114, may be subjected to a partial densification process, by partially densifying the dielectric material. The partial densification process may be performed by subjecting the dielectric material, for instance, to a steam annealing procedure. In one example, steam annealing may be performed in the presence of water vapor at about 500° C. for about 3 hours to about 6 hours. This partial densification process facilitates in selectively oxidizing the dielectric material in presence of water vapor present during, for instance, steam annealing process and creating a partially densified dielectric material 124 over (for instance, above the protective masks, including the protective mask overlap, overlying the adjacent sacrificial gate structures) and between adjacent sacrificial gate structures 110, 112 and 114.

Figure 3:
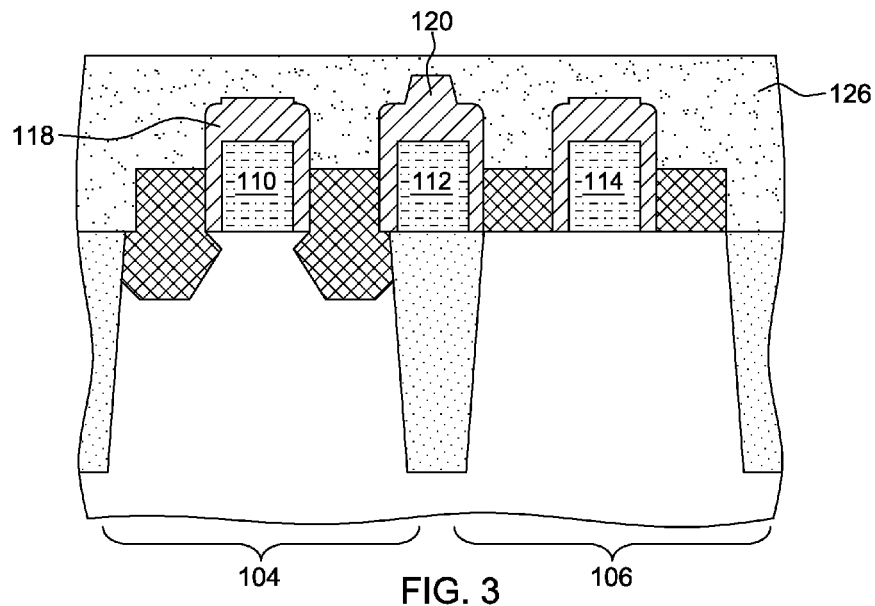
FIG. 3 depicts the structure of FIG. 2 after further densification of partially densified dielectric material has been performed to create a modified dielectric material, in accordance with one or more aspects of the present invention.

As illustrated in FIG. 3, partially densified dielectric material 124 of FIG. 2 disposed over and between adjacent sacrificial gate structures 110, 112 and 114, may be subjected to a further densification process. This further densification process facilitates in further densifying the partially densified dielectric material to create a modified dielectric material 126 over and between adjacent sacrificial gate structures 110, 112 and 114. Modified dielectric material 126 is disposed over, for instance, protective masks 118, including protective mask overlap 120, overlying the adjacent gate structures. This further densification process may be performed by exposing the partially densified dielectric material, for instance, to a conventional remote plasma treatment. In one example, partially densified dielectric material 124 of FIG. 2 may be exposed to plasma using carrier gases including, but not limited to, hydrogen ($H_2$), argon (Ar), helium (He) or combinations thereof and a stable nitrogen precursors including, but not limited to, $NH_3$ and $N_2$, $NH_3$ & $H_2$ and the like. This further densification process performed by exposing to remote plasma treatment advantageously facilitates in controlling recessing of the dielectric material disposed over the adjacent gate structures and the protective masks disposed at the upper surfaces of the sacrificial gate structures, during subsequent fabrication processing.

Figure 4:
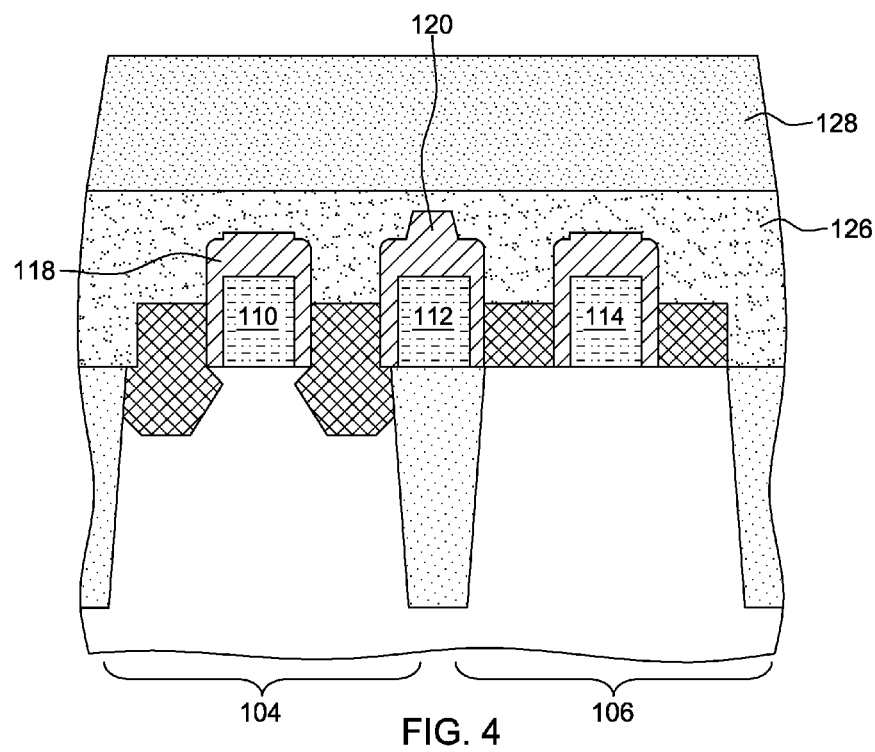
FIG. 4 depicts the structure of FIG. 3 with a high aspect ratio oxide having been provided over the modified dielectric material, in accordance with one or more aspects of the present invention.

FIG. 4 depicts the structure of FIG. 3 after subjecting modified dielectric layer 126 (see FIG. 3), disposed over and between adjacent sacrificial gate structures 110, 112 and 114, to a further densification process. This further densification process may be performed by treating the modified dielectric material with, for instance, a high density plasma deposition (HDP-deposition) or a plasma-enhanced tetraethyl ortho silicate deposition (PTEOS-deposition), to create a very dense and high quality silicon-rich oxide layer 128 over modified dielectric material 126 (see FIG. 3). In one example, silicon-rich oxide layer 128 may include or be fabricated of a high aspect ratio oxide such as, for instance, high-density-plasma silicon dioxide ($HDP-SiO_2$) or a silicon-rich oxide layer deposited by plasma-enhanced CVD process (PECVD silicon dioxide). By way of example, high-density-plasma silicon dioxide ($HDP-SiO_2$) may be deposited using a conventional chemical vapor deposition (CVD) process combined with a simultaneous sputtering process. In a specific example, the high density plasma silicon dioxide ($HDP-SiO_2$) may be deposited by a high density plasma using a gas mixture including, for example, silane, oxygen and argon. The high aspect ratio oxide such as, for example, high density plasma oxide (HDP-oxide) is resistant to the conventional processing techniques, for instance, etching processes, typically employed, during subsequent fabrication processing. Although the high aspect ratio oxide layer, for instance, high-density-plasma silicon dioxide ($HDP-SiO_2$) may have a conventional thickness, the thickness of high aspect ratio oxide may vary from about 1.5 K (1500 A°) to about 3 K (3000 A°). The high-aspect ratio oxide layer advantageously facilitates in further controlling recessing of the dielectric material, during subsequent fabrication processing. Although not critical to the invention, in one implementation, the process of exposing the partially densified dielectric material, to remote plasma treatment discussed in connection with FIG. 3, may be performed in the same process chamber as the deposition of high-aspect ratio oxide layer, resulting in a cost-effective fabrication processing step.

Figure 5:
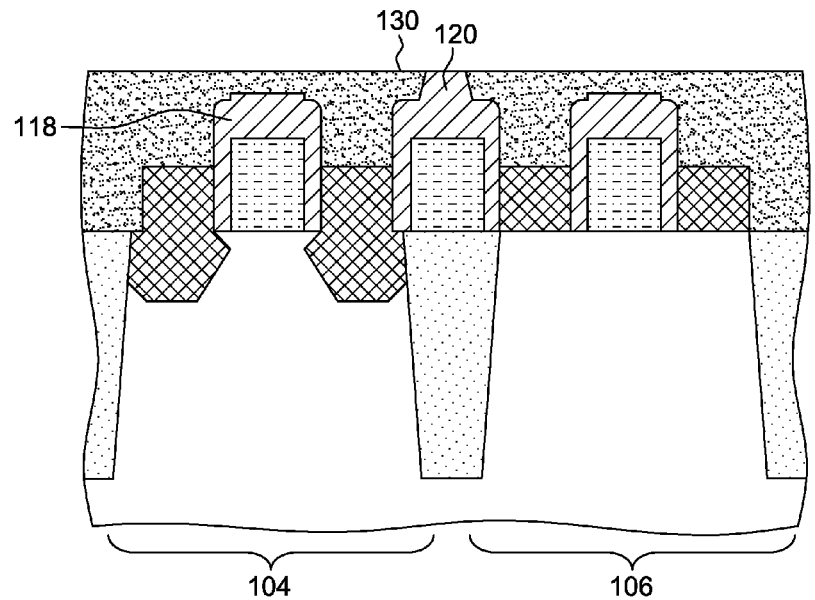
FIG. 5 depicts the structure of FIG. 4 after planarization thereof, in accordance with one or more aspects of the present invention.

FIG. 5 depicts the structure, in accordance with the present embodiment, after conventional chemical-mechanical polishing (CMP) of silicon-rich oxide layer 128 of FIG. 4 (for instance, high aspect ratio oxide layer) disposed over the modified dielectric material. The chemical-mechanical polishing may be performed, stopping on protective mask 118, which means (in this example) stopping on protective mask overlap 120 (for instance, at the junction) of p-type transistor 104 and n-type transistor 106, since this has the greatest height. The result is a substantially planar plasma-treated surface 130 formed at protective mask overlap 120 of p-type transistor 104 and n-type transistor 106. Note that substantially planar plasma-treated surface 130, created at protective mask overlap 120 of p-type transistor 104 and n-type transistor 106, advantageously facilitates in controlling recessing of the dielectric material disposed over the adjacent gate structures and the protective masks, disposed at the upper surfaces of the sacrificial gate structures, and thus facilitates in achieving gate height uniformity, during subsequent fabrication processing.

Alternately, by way of example, FIGS. 6-10 depict one detailed alternate embodiment of a method of facilitating gate height uniformity by controlling recessing of the dielectric material surrounding the sacrificial gate structures and the protective masks disposed at the upper surfaces of the sacrificial gate structures.

Figure 6:
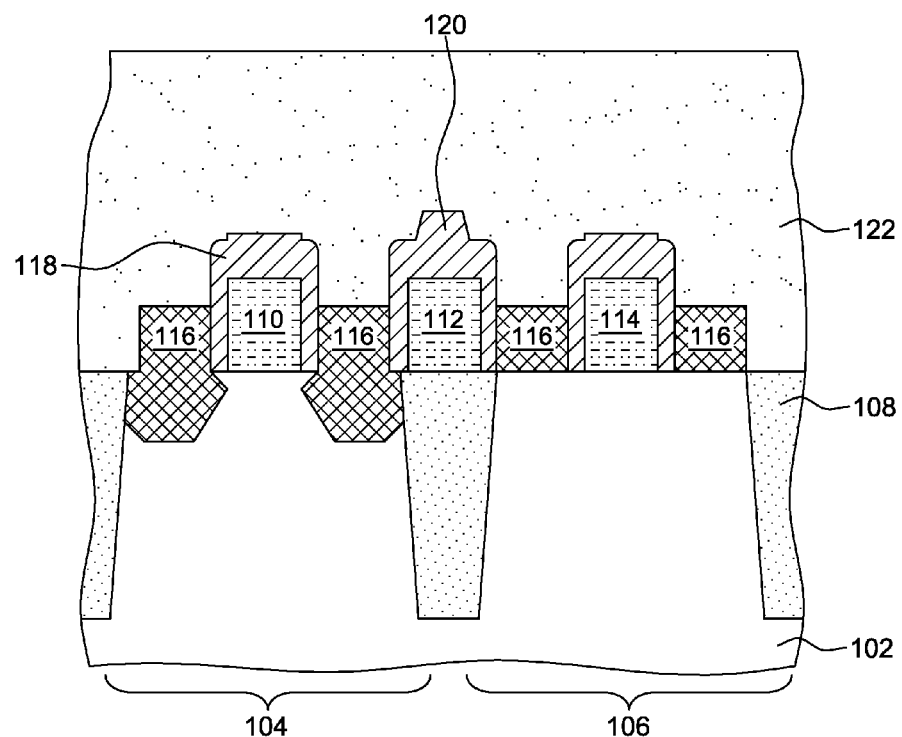
FIG. 6 depicts the alternate embodiment of an intermediate structure, including a plurality of sacrificial gate structures and dielectric material surrounding the sacrificial gate structures, obtained during semiconductor fabrication process, in accordance with one or more aspects of the present invention.

FIG. 6 illustrates an alternate intermediate structure 100, the alternate intermediate structure 100 attained, being similar to that discussed in connection with FIG. 1, during semiconductor fabrication processing, in accordance with one or more aspects of the present invention. At the point of fabrication, depicted in FIG. 6, intermediate structure 100 includes a substrate 102, such as a bulk semiconductor material, for example, a bulk silicon wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement (SRI) substrates and the like. Substrate 102 may in addition or instead include various isolations, dopings, and/or device features. The substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

Continuing with FIG. 6, intermediate structure 100 includes a plurality of transistors, for instance, P-type field-effect transistor (PFET) 104 (referred to hereafter, as p-type transistor) and N-type field-effect transistor (NFET) 106 (referred to, hereafter, as n-type transistor) formed over substrate 102. The p-type transistor 104 and n-type transistor 106 are laterally separated by isolation features 108, such as, for example, shallow trench isolation features (STI). The formation of isolation regions, such as shallow trench isolation may include, for instance, forming a recess within the substrate and filling the trench with a dielectric material, such as, for example, high-density plasma (HDP) oxide or TEOS (tetraethylorthosilicate) base silicon oxide, silicon nitride and the like. Although not critical to the invention, p-type transistor 104 and n-type transistor 106 may include, corresponding adjacent sacrificial gate structures 110, 112 and 114 respectively, with sacrificial gate structure 112 being disposed at the junction of p-type transistor 104 and n-type transistor 106. In one example, the sacrificial gate structures may include a sacrificial gate material, such as, for example, amorphous-silicon, to hold the gate position for subsequent metal gate structures to be formed.

Although not critical to the invention, source and drain region (hereafter referred to as active region 116) is provided over substrate 102. Active region 116 may be formed using any suitable techniques, including, for example, ion implantation, epitaxial growth of the embedded source/drain materials and activation anneals.

A protective mask 118 may further be provided along the sidewalls and the upper surfaces of respective adjacent sacrificial gate structures 110, 112 and 114. Protective mask 118 may be deposited using conventional deposition processes, such as, for example, chemical vapor deposition (CVD), low-pressure CVD, or plasma-enhanced CVD (PE-CVD), atomic layer deposition (ALD). In one example, protective mask 118 may have a conventional thickness and may include or be fabricated of a material such as, for example, silicon nitride. In a specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogen-free precursor such as, for example, bis(t-butylamino)silane (BTBAS) ($SiC_8N_2H_{22}$) and ammonia ($NH_3$) at about 550° C. As understood by one skilled in art, protective mask 118 creates a protective mask overlap 120 over the upper surface of sacrificial gate structure 112, disposed at the junction of p-type transistor 104 and n-type transistor 106. Although not critical to the invention, in one example, a layer of protective mask 118 may also extend over active region 116 to facilitate protection of the active region, during subsequent fabrication processing.

A dielectric material 122 may then be disposed over (for instance, above the protective masks, including the protective mask overlap, overlying the adjacent sacrificial gate structures) and between adjacent sacrificial gate structures 110, 112 and 114. As one example, dielectric material 122 may be or include an organic material such as, a field oxide of relatively low quality within the spectrum of available oxides. For instance, the field oxide may include, a flowable oxide such as, for example, a hydrogen silsesquioxane polymer or a carbon-free silsesquioxane polymer, which may be deposited as the dielectric material 122 by flowable chemical vapor deposition (F-CVD). In another example, dielectric material 122 may include, but not limited to, silicon nitride (SiN), silicon nitride ($Si_3N_4$), silicon oxide ($SiO_2$), fluorinated silicate glass (FSG). By way of example, in one implementation, conformally deposited dielectric material 122, above the protective mask overlap of p-type transistor 104 and n-type transistor 106, may be of conventional thickness to allow subsequent planarization processes. In one example, dielectric material 122 may be conformally deposited about 2K (2000 A°) to about 5 K (5000 A°) above protective mask overlap 120, (for instance, at the junction) of p-type transistor 104 and n-type transistor 106.

Figure 7:
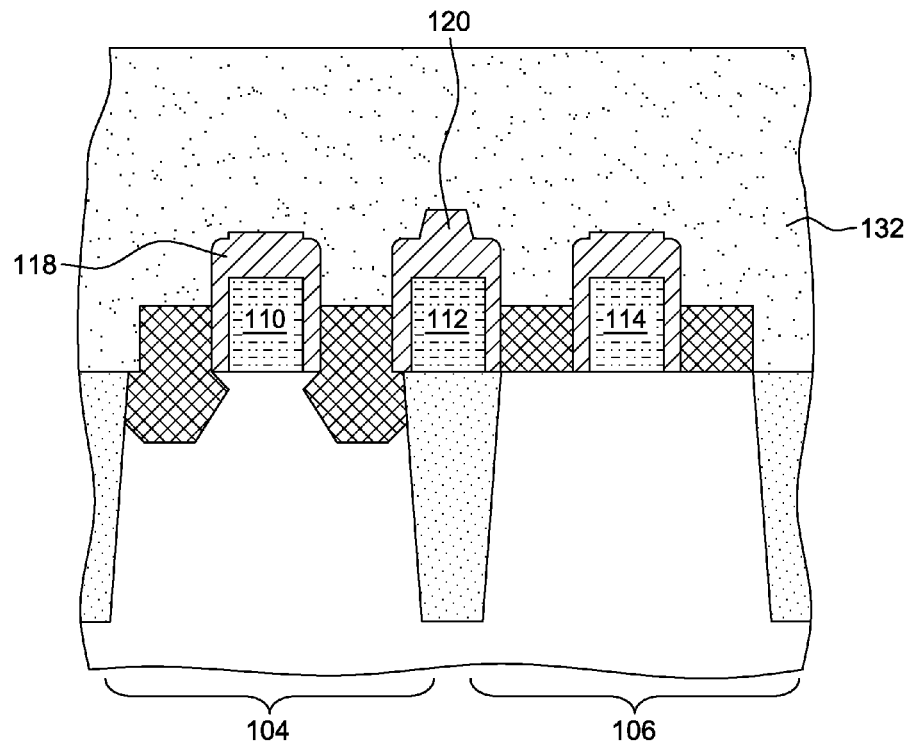
FIG. 7 depicts the structure of FIG. 6 after a partial densification of dielectric material has been performed to create a partially densified dielectric material, in accordance with one or more aspects of the present invention.

As depicted in FIG. 7, dielectric material 122 (see FIG. 6), disposed over and between adjacent sacrificial gate structures 110, 112 and 114, may be subjected to a partial densification process, by partially densifying the dielectric material. As discussed above, the partial densification process may be performed by subjecting dielectric material 122 (see FIG. 6), for instance, to a steam annealing procedure. In one example, steam annealing may be performed in the presence of water vapor at about 500° C. for about 3 hours to about 6 hours. This partial densification process facilitates in selectively oxidizing the dielectric material in presence of water vapor present during, for instance, steam annealing process and creating a partially densified dielectric material 132 over (for instance, above the protective masks, including the protective mask overlap, overlying the adjacent sacrificial gate structures) and between adjacent sacrificial gate structures 110, 112 and 114.

Figure 8:
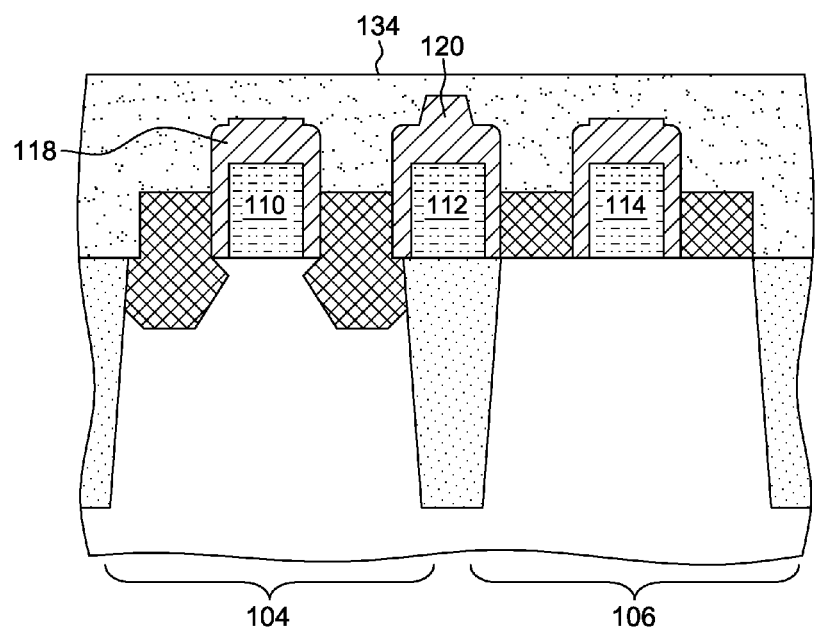
FIG. 8 depicts the structure of FIG. 7 after controlled planarization of the partially densified dielectric material has been performed, in accordance with one or more aspects of the present invention.

As illustrated in FIG. 8 and in accordance with the process embodiment depicted, partially densified dielectric material 132 (see FIG. 7) disposed over and between adjacent sacrificial gate structures 110, 112 and 114, may be subjected to an additional densification process. This additional densification process may be performed by subjecting partially densified dielectric material 132 (see FIG. 7) to a controlled planarization process, for instance, controlled chemical-mechanical polishing, stopping substantially above protective mask 118, which means (in this example) stopping substantially above protective mask overlap 120 of p-type transistor 104 and n-type transistor 106, since this has the greatest height. In a specific example, the controlled chemical-mechanical polishing may be terminated at, for instance, about 20 nanometers to about 50 nanometers, above protective mask overlap 120 of p-type transistor 104 and n-type transistor 106, the termination of the controlled chemical-mechanical polishing being dependent on the resultant height of the protective mask overlap. As understood, controlled in this context means that polish rate may be controlled by ambient conditions such as temperature and any conventional process conditions typically employed, during conventional planarization process. This additional densification process advantageously facilitates in further densifying the remaining portion of the partially densified dielectric material and creating a substantially planar surface 134 above protective mask overlap of p-type transistor 104 and n-type transistor 106.

Figure 9:
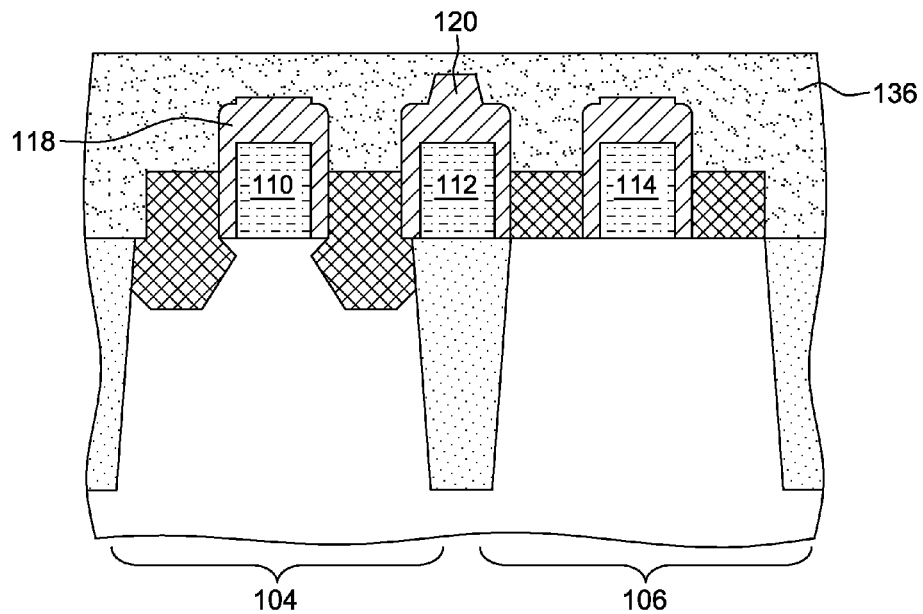
FIG. 9 depicts the structure of FIG. 8 after further densification of the partially densified dielectric material has been performed, in accordance with one or more aspects of the present invention.

As depicted in FIG. 9, substantially planar partially densified dielectric material 134 (see FIG. 8), after having been additionally densified by the controlled planarization process, may be subjected to a further densification process. This further densification process facilitates in further densifying the substantially planar partially densified dielectric material 134 (see FIG. 8) to create a modified dielectric material 136 over and between adjacent sacrificial gate structures 110, 112 and 114. Modified dielectric material 136 is disposed over, for instance, protective masks 118, including protective mask overlap 120, overlying the adjacent gate structures. This further densification process may be performed by exposing substantially planar partially densified dielectric material 134 of FIG. 8, for instance, to a conventional remote plasma treatment. In one example, the substantially planar partially densified dielectric material may be exposed to plasma using carrier gases including, but not limited to, hydrogen ($H_2$), argon (Ar), helium (He) or combinations thereof and stable nitrogen precursors including, but not limited to, $NH_3$ and $N_2$, $NH_3$ & $H_2$ and the like. This further densification process performed by exposing to remote plasma treatment advantageously facilitates in further densifying the substantially planar partially densified dielectric material and in controlling recessing of the dielectric material disposed over the adjacent gate structures and the protective masks disposed at the upper surfaces of the sacrificial gate structures, during subsequent fabrication processing.

Figure 10:
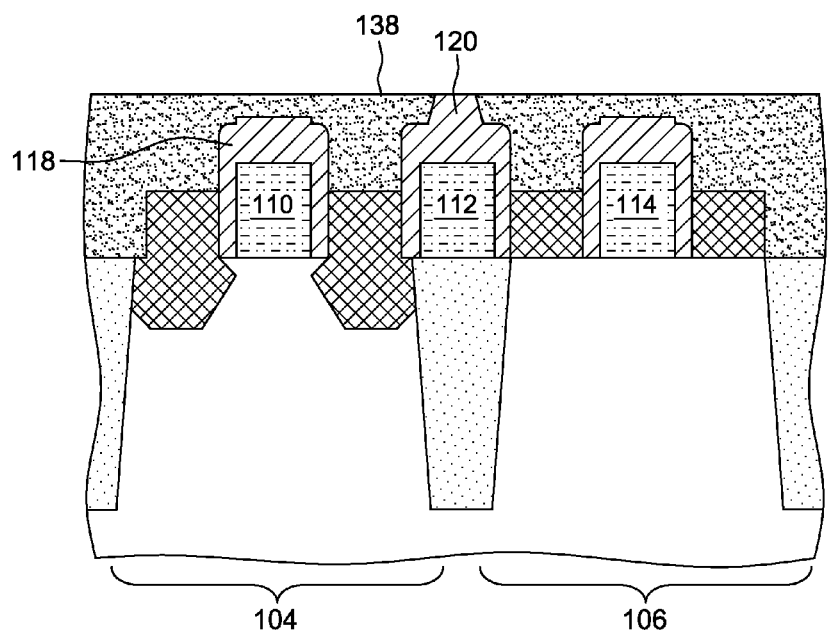
FIG. 10 depicts the structure of FIG. 9 after planarization thereof, in accordance with one or more aspects of the present invention.

FIG. 10 depicts the structure, in accordance with the present embodiment, after conventional chemical-mechanical polishing (CMP) of modified dielectric material 136 (see FIG. 9) disposed over and between the adjacent sacrificial gate structures 110, 112 and 114. The chemical-mechanical polishing may be performed, stopping on protective mask 118, which means (in this example) stopping on protective mask overlap 120 (for instance, at the junction) of p-type transistor 104 and n-type transistor 106, since this has the greatest height. The result is a substantially planar surface 138 formed at protective mask overlap 120 of p-type transistor 104 and n-type transistor 106. Note that the substantially planar surface 138 created at protective mask overlap 120 of p-type transistor 104 and n-type transistor 106 advantageously facilitates in controlling recessing of the dielectric material disposed over the adjacent gate structures and the protective masks disposed at the upper surfaces of the sacrificial gate structures, and thus facilitates in achieving gate height uniformity, during subsequent fabrication processing.

Figure 11:
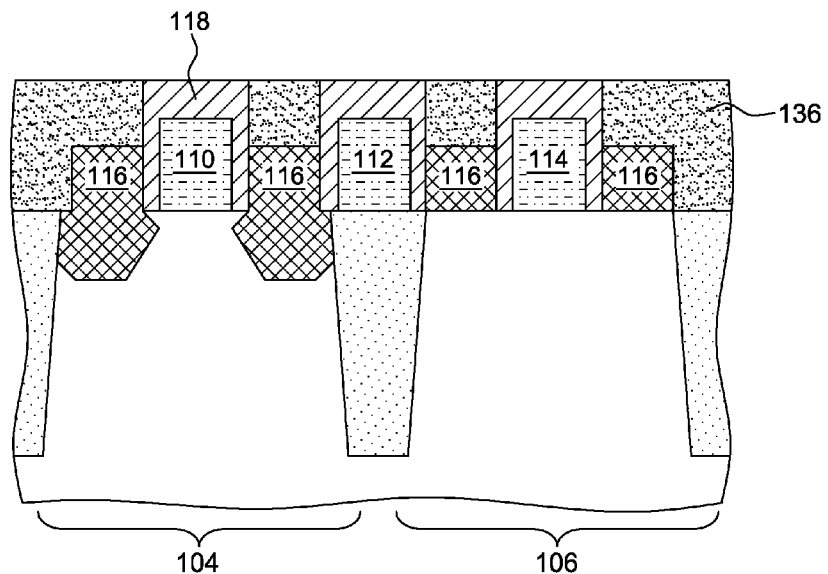
FIG. 11 depicts the structure of FIG. 5 and FIG. 10 after further planarization and removal of protective mask overlap, in accordance with one or more aspects of the present invention.
Figure 12:
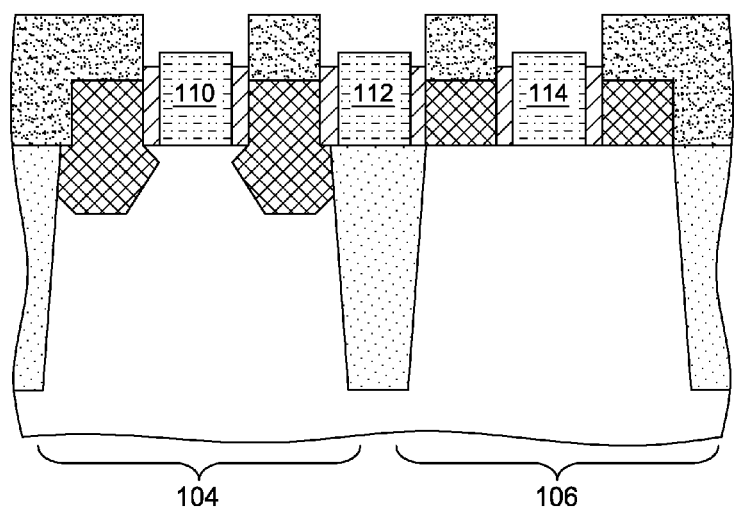
FIG. 12 depicts the structure of FIG. 11 with sacrificial gate structures having been exposed, in accordance with one or more aspects of the present invention.
Figure 13:
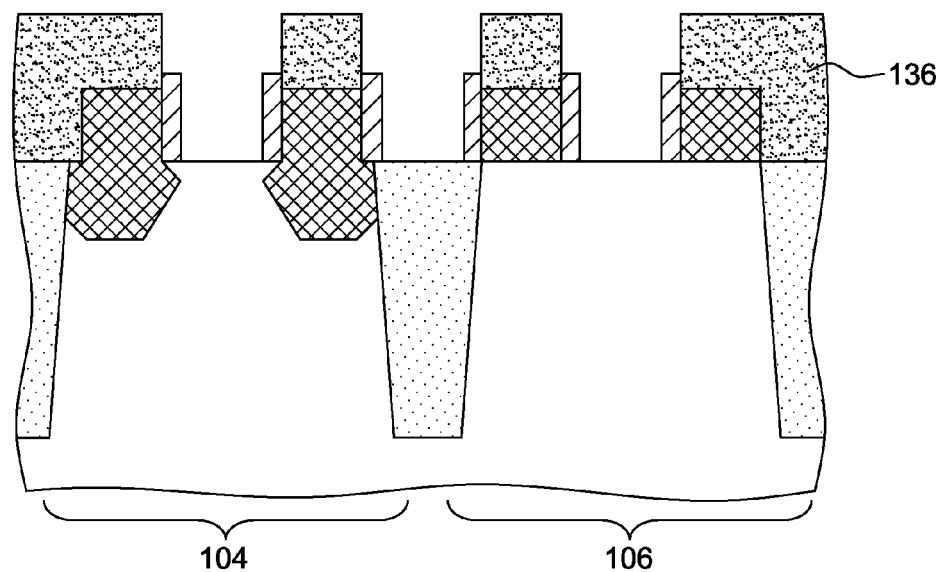
FIG. 13 depicts the intermediate structure of FIG. 12 after removal of the exposed sacrificial gate structures, in accordance with one or more aspects of the present invention.

When or after the intermediate structure shown in FIG. 5 or FIG. 10 has been obtained, such structure may be further processed as shown in FIGS. 11-13, as further discussed, for example, herein to achieve intermediate semiconductor structure as shown in FIG. 13.

As illustrated in FIG. 11, a non-selective chemical-mechanical polish or a non-selective etching may be employed to the structure of FIG. 5 or FIG. 10, to remove protective mask over lap 120 (see FIG. 10) disposed over (for instance, at the junction) of p-type transistor 104 and n-type transistor 106 along with the excess modified dielectric material 136. The chemical-mechanical polishing may be performed, using the upper surfaces of protective mask 118, as an etch stop, resulting in the protective masks being substantially co-planar with each other.

FIG. 12 depicts the structure of FIG. 11 after further processing to recess protective masks 118 (see FIG. 11) protecting the underlying adjacent sacrificial gate structures 110, 112 and 114. Any suitable etching process such as, conventional isotopic or anisotropic dry-etching processes such as, reactive ion etching or plasma etching, may be employed resulting in exposing adjacent sacrificial gate structures 110, 112 and 114. In one specific example, reactive ion etching may be performed using remote plasma involving process gases such as nitrogen trifluoride ($NF_3$) and hydrogen ($H_2$). In one example, the protective mask may be recessed to a height of about 5 nanometers to about 10 nanometers below the upper surfaces of sacrificial gate structures 110, 112 and 114.

As illustrated in FIG. 13, the exposed adjacent gate structures, holding the gate positions for subsequent metal gate structures to be formed, may selectively be removed using any suitable conventional etching process(es). In one example, the exposed adjacent gate structures may be removed using a conventional anisotropic dry etching process or an isotropic wet etching process. In one example, isotropic wet etching may be performed using wet etchants such as, for example, ammonium hydroxide or HF:Nitric acid:Acetic acid solution (also HNA etch). In an alternate example, reactive ion etching or plasma etching may also be employed to remove the exposed adjacent gate structures.

Advantageously, the methods and resultant semiconductor devices disclosed herein enhance replacement gate processing by producing replacement gates of more uniform height, while also protecting the dielectric material during, for instance, high-k pre-cleaning of the gate openings prior to formation of the metal gate structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    forming a semiconductor device with a p-type transistor and a n-type transistor, the p-type transistor and the n-type transistor comprising plurality of sacrificial gate structures and a protective mask at an upper surface thereof;
    providing a dielectric material over and between the plurality of sacrificial gate structures;
    partially densifying the dielectric material to form a partially densified dielectric material which extends, at least in part, over a protective mask overlap;
    further densifying the partially densified dielectric material to create a modified dielectric material; and
    creating substantially planar surface on the modified dielectric material and on the protective mask overlap, to control dielectric material recess and gate height.

2. The method of claim 1 wherein partially densifying the dielectric material comprises annealing the dielectric material.

3. The method of claim 1 wherein further densifying the partially densified dielectric material comprises exposing the partially densified dielectric material to remote plasma.

4. The method of claim 1 wherein further densifying comprises treating the modified dielectric material with at least one of a high density plasma deposition or a plasma-enhanced tetraethyl ortho silicate deposition.

5. The method of claim 1 wherein creating the substantially planar surface comprises planarization of the modified dielectric material.

6. The method of claim 5 wherein the modified dielectric material comprises a high aspect ratio oxide.

7. The method of claim 5 wherein the planarization forms a plasma-treated surface at the protective mask overlap of the p-type transistor and the n-type transistor.

8. The method of claim 1 wherein the dielectric material is conformally deposited about 0 nanometers to about 50 nanometers above the protective mask overlap of the p-type transistor and the n-type transistor.

9. The method of claim 1 wherein further densifying the dielectric material comprises performing controlled planarization of the partially densified dielectric material, the controlled planarization being performed prior to performing further densification of the partially densified dielectric material.

10. The method of claim 9 wherein further densifying the dielectric material comprising partially removing the partially densified dielectric material prior to further densifying the partially densified dielectric material.

11. The method of claim 10 wherein partially removing comprises planarization of the partially densified dielectric material to form a substantially planar surface of about 20 nanometers to about 50 nanometers over the protective mask overlap of the p-type transistor and the n-type transistor.

12. The method of claim 9 wherein creating the substantially planar surface comprises planarization of the modified dielectric material.

13. The method of claim 12 wherein the planarization forms a substantially planar surface at the protective mask overlap of the p-type transistor and the n-type transistor.

14. The method of claim 1 further comprising removing the protective masks to expose the sacrificial gate structures thereafter, and subsequently removing exposed sacrificial gate structures.

* * * * *